United States Patent
McCullough

(10) Patent No.: US 9,568,537 B1
(45) Date of Patent: Feb. 14, 2017

(54) APPARATUS AND METHOD FOR MEASURING AND CONTROLLING THE INTERNAL TEMPERATURE OF A SEMICONDUCTOR DEVICE

(71) Applicant: Texas Instruments Incorporated, Dallas, TX (US)

(72) Inventor: Jason Christopher McCullough, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 7 days.

(21) Appl. No.: 14/813,282

(22) Filed: Jul. 30, 2015

(51) Int. Cl.
  *G01R 31/10* (2006.01)
  *G01R 31/26* (2014.01)
(52) U.S. Cl.
  CPC .................. *G01R 31/2601* (2013.01)
(58) Field of Classification Search
  CPC .............. G01R 1/07378; G01R 31/003; G01R 31/2874; G01R 31/2607; G01R 31/2891; G01R 31/2856
  See application file for complete search history.

(56) References Cited

U.S. PATENT DOCUMENTS 7,443,754 B2 * 10/2008 Sako .................... G11C 11/406
  365/212
2005/0264971 A1 * 12/2005 Morino .................. G01K 3/005
  361/103

\* cited by examiner

*Primary Examiner* — Tung X Nguyen
(74) *Attorney, Agent, or Firm* — Charles A. Brill; Frank D. Cimino

(57) ABSTRACT

A method for controlling the temperature of a semiconductor device-under-test (DUT) by forming an apparatus (100) including a feedback loop between a Temperature Forcing Unit (TFU, 110) conductively tied to an Automated Test Equipment (ATE, 120) having a chamber encasing the DUT (122), and the ATE conductively connected to a Control Computer (CC, 130) conductively tied back to the TFU. The CC is calibrated with reference values of temperatures and measured voltages using a diode integral with a diode-isolated circuit protecting a pin of the DUT against electrostatic discharge. The thermal air stream to stabilize the temperature of the ATE chamber loaded with the DUT is reset by the CC until the DUT is stabilized at the goal temperature.

9 Claims, 7 Drawing Sheets

APPARATUS AND METHOD FOR MEASURING AND CONTROLLING THE INTERNAL TEMPERATURE OF A SEMICONDUCTOR DEVICE

FIELD

Embodiments of the invention are related in general to the field of semiconductor devices and processes, and more specifically to the structure and method of a system for measuring and maintaining the true temperature of a semiconductor circuit.

DESCRIPTION OF RELATED ART

When the characteristics of a semiconductor component or integrated circuit (IC) have to be measured as a function of temperature, the temperature of the actual semiconductor chip of the component or IC has to be known accurately. Due to their miniature size and sensitive connections, however, semiconductor chips have to be encapsulated in a package in order to allow handling of the packaged device ("device-under-test", DUT) in the environment of an electronic system. Consequently, it is the temperature of the package which is typically measured for all practical purposes; the temperature of the chip proper is extrapolated from the package temperature.

One of the popular temperature measurement techniques is the forced air control method. The DUT is placed on a support in an enclosed chamber, where heating elements provide a stable gas stream of the desired DUT temperature. After allowing an adequate soak time to elapse for thermal equilibrium, the DUT measurements are performed. It has been found, however, that even when fans below and above the DUT are installed to equalize the gas in the chamber, a residual thermal gradient between the heating element and the rest of the chamber may remain. The DUT may never reach the set temperature, because the thermal stream does not create an adequately sealed thermal chamber. Furthermore, there is still the uncertainty of the true temperature of the chip inside the device package.

Another temperature measurement technique modifies the previous method by forcing the gas according to feedback from a thermocouple placed in close proximity to the DUT. While this mode reduces the settling time considerably, the gas temperature may go beyond the desired DUT temperature. In addition, the proper placement of the thermocouple remains debatable, since the air flow may influence the thermocouple more than the actual DUT temperature.

Integrated circuits (ICs) may be severely damaged by electrostatic discharge (ESD) events. A major source of ESD exposure to ICs is from the human body (described by the "Human Body Model", HBM); the discharge of the human body generates peak currents of several amperes to the IC for about 100 ns. A second source of ESD is from metallic objects (described by the "Machine model", MM); it can generate transients with significantly higher rise times and current levels than the HBM ESD source. A third source is described by the "charged device model" (CDM), in which the IC itself becomes charged and discharges to ground in rise times less than 500 ps.

One common scheme to protect an input/output (I/O) pad against ESD failure uses metal-oxide-semiconductor (MOS) ICs, such as nMOS transistor with its drain connected to the pin to be protected and its source tied to ground, and relies on the mode of a parasitic bipolar transistor (the source acts as the emitter, the drain as the collector, and the bulk semiconductor as the base) during an ESD event to provide a low impedance current path to ground. The protection level or failure threshold can be set by varying the nMOS device width.

Another common protection scheme used in MOS ICs employs a first diode with its cathode connected to the power ($V_{DD}$) terminal for positive ESD stress and its anode connected to the I/O pad to be protected. The diode has to be made of large area, since the on-resistance of the diode determines the effectiveness. A second diode has its anode connected to ground potential ($V_{ss}$) for negative ESD stress and its cathode to the pad.

SUMMARY

Applicant solved the problem of determining the true temperature of a semiconductor chip encapsulated in a package, when he identified a methodology of employing the pn-junction as temperature sensor of a diode, which is routinely incorporated into the chip circuitry for other purposes. Such diode can be found as integrated into a diode pin's protection circuitry against electrostatic discharge (ESD) damage. In the protection circuitry, the diode does normally not participate in routine device operation and can thus temporarily be employed for the role of a sensitive thermometer.

To prevent negative effects on the temperature sensing accuracy, the pin needs to be selected so that other circuitry connected to the pin does not interfere with the linear regime of the diode's current-voltage characteristic. Furthermore, the current through the diode is small but can be increased orders of magnitude so that the resulting current voltage characteristic displays indeed the required linear behavior.

The principal of the silicon bandgap temperature sensor is that the forward voltage of a silicon diode is temperature dependent according to the equation:

$$I = I_0[e^{(qV/kT)} - 1].$$

Plotting the current/voltage characteristic of the diode in a semi-logarithmic diagram, the exponential increase of the current at low currents displays a straight line as a function of the linearly increasing voltage. The slope of this straight line is a sensitive function of the temperature at the location of the measured diode. After saturation, the current-voltage characteristic of the diode resembles the characteristic of a resistor.

For the purpose as temperature sensor, the characterization process of the DUT, wherein the diode is integral, has to be performed in a well-controlled chamber without temperature gradients. The chamber must best contain internally circulated air so that the ambient air surrounding the DUT is equalized in temperature. The temperature of the chamber can thus be maintained by the thermal stream within the chamber.

Based on the temperature determined from the slope of the I-V characteristic, the thermal stream's forcing temperature can be updated with the help of a feedback loop provided by the software of a PID (proportional-integral-derivative) controller. The PID controller calculates an error value as the difference between a measured process variable and a desired set point.

DETAILED DESCRIPTION OF THE PREFERRED EMBODIMENTS

Figure 1:
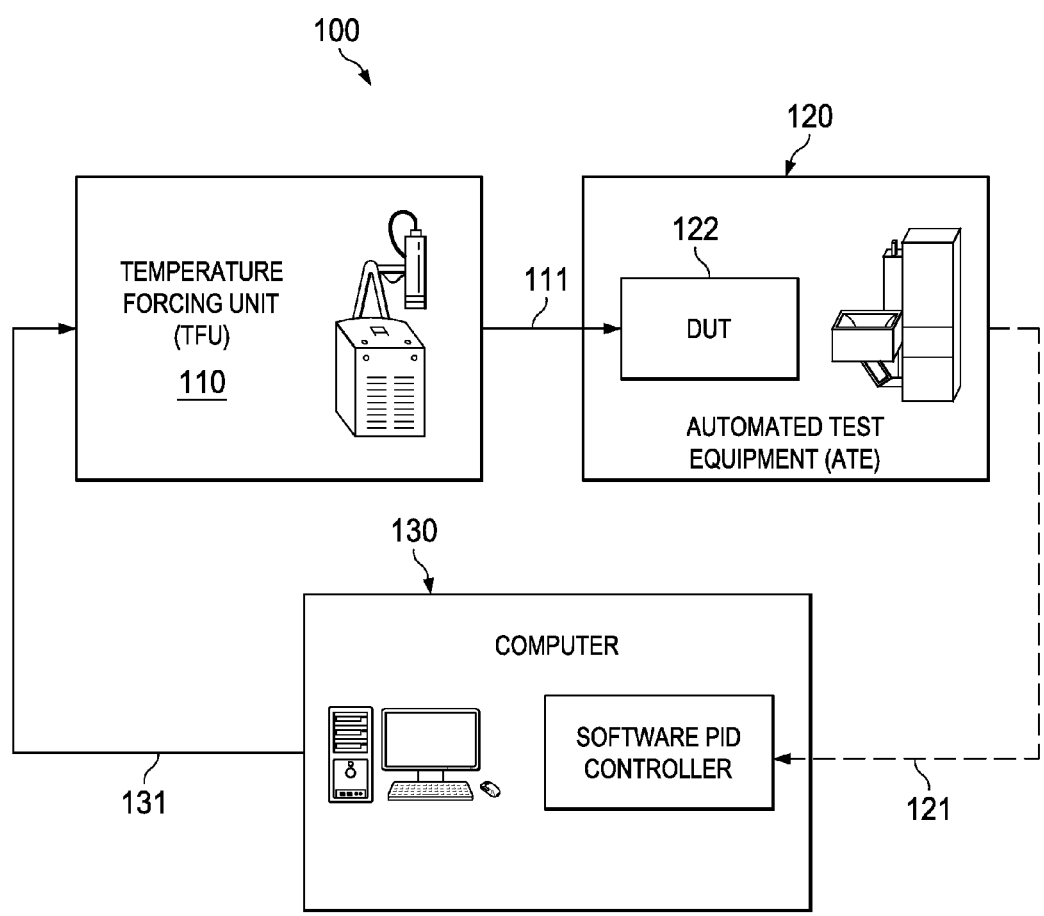
FIG. 1 shows the feedback loop including a Temperature Forcing Unit (TFU) conductively tied to an Automated Test Equipment (ATE) conductively connected to a Control Computer (CC) conductively tied back to the TFU; the CC includes the software of a proportional-integral-derivative (PID) controller, which regulates the temperature of the forced-air in the TFU of FIG. 2.

FIG. 1 illustrates an embodiment of the invention: A series of equipment interconnected as a feedback loop 100 used to stabilize the temperature of a semiconductor device (device-under-test, DUT), measure the internal temperature as the true temperature of the DUT, and involve a computer to control the change of the temperature to another value, feeding back the result for stabilization and correction. The feedback loop includes a Temperature Forcing Unit (TFU) 110, which is conductively tied by connector 111 to an Automated Test Equipment (ATE) 120. In turn, the ATE is conductively connected by cable 121 to a Control Computer (CC) 130, which in turn is conductively looped back by connector 131 to the TFU 110.

Figure 2:
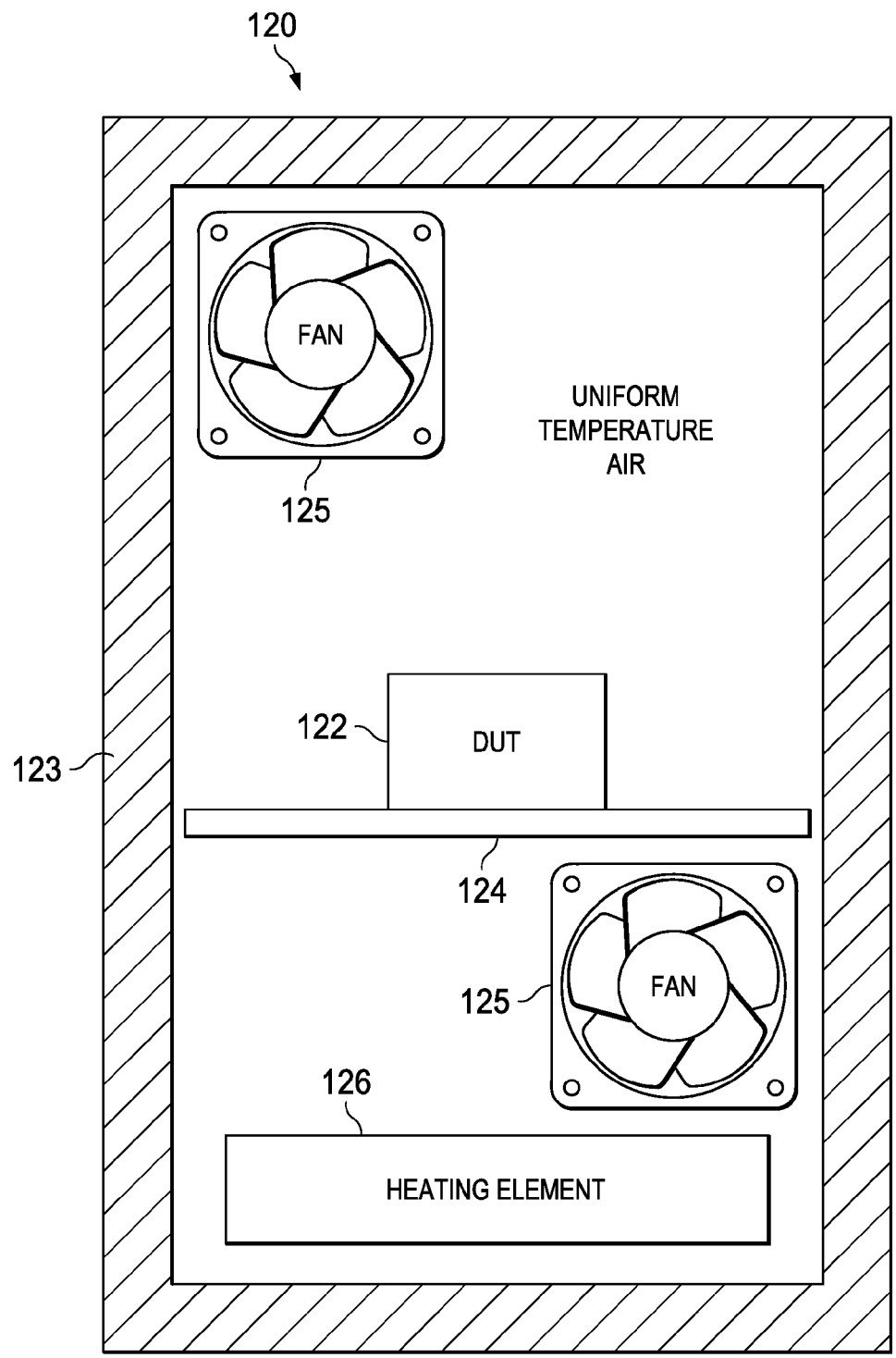
FIG. 2 displays schematically the temperature control arrangement of the forced air in the chamber of the Automated Test Equipment (ATE); the chamber is free of temperature gradients for precise temperature measurements of the device-under-test (DUT).

An example of a commercially available TFU 110 is TP04390A ThermoStream, manufactured by Temptronic Corporation. An example of a commercially available ATE for semiconductor devices is UltraFLEX Test System, manufactured by Teradyne. FIG. 2 depicts schematically the temperature control arrangements of the forced air in the chamber of an ATE (120), which aim at keeping the chamber free of temperature gradients for precise temperature measurements of the semiconductor device-under-test (DUT) 122. As FIG. 2 shows, test chamber is thermally insulated from the environment by walls 123. The DUT 122 rests inside the chamber on a support 124, which includes the electrical connections to the DUT. A plurality of air fans 125 are positioned above, below, and around DUT 122 to obtain and maintain uniform temperature air inside the chamber. The chamber further includes provisions 126 for heating and cooling the air.

Computer 130 includes a proportional-integral-derivative (PID) software, which allows the computer to operate as a control loop feedback mechanism. The PID software calculates an error value as the difference between a measured process variable (such as the measured temperature) and a desired setpoint (such as the goal temperature). Computer 130 is tied to the DUT 122 by connection 121 and to the TFU by connection 131.

Figure 3:
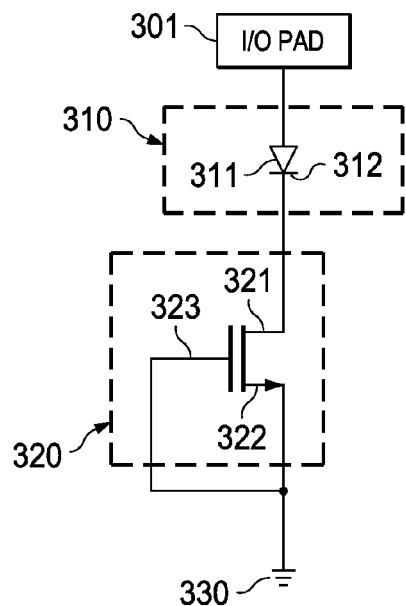
FIG. 3 shows the diagram of a typical ESD protection circuit integrated with of a pin of the semiconductor device-under-test (DUT).

FIG. 3 displays the block diagram of the concept referred to as the diode isolated grounded-gate MOS concept for protecting fail-safe, RF, wireless, and other advanced ICs in a semiconductor device against ESD events. The input/output (I/O) pad 301 to be protected is in series with the forward biased diode 310 and MOS transistor 320 to ground potential 330. Pad 301 is connected with the anode 311 of diode 310; the cathode 312 of the diode is tied to the drain 321 of MOS transistor 320. Gate 323 and source 322 of transistor 320 are grounded.

The integrated circuit (I/C) and the device for ESD protection are fabricated in a semiconductor substrate. The term "substrate" refers herein to the starting semiconductor wafer, which, in present manufacturing, typically has p-type doping. For many applications, the first conductivity type referenced above is p-type and the opposite conductivity type is n-type. With this selection, the semiconductor substrate mentioned above is a p-type substrate, the MOS transistor an nMOS transistor, the diode a pn-, and the silicon-controlled rectifier a pnpn-SCR. Frequently, but not necessarily, an epitaxial layer of the same conductivity type as the substrate has been deposited over the substrate; in this case the term "substrate" refers to epitaxial layer plus starting semiconductor. For preferred p-type substrates, the sheet resistance range is from about 200 to 500 Ω/square; the selection of the substrate resistivity and sheet resistance determines the size of the substrate resistance.

The principal of the silicon bandgap temperature sensor is that the forward voltage $V_F$ of a silicon diode is temperature dependent. Comparing the bandgap voltages at two different currents $I_{F1}$ and $I_{F2}$, the temperature dependence is expressed by:

$$\Delta V_F = kT/q \cdot \ln(I_{F1}/I_{F2}),$$

or re-written:

$$I_F = I_0 [e(qV_F/kT) - 1],$$

where $I_F$=net forward current flowing through the diode;
$I_0$=diode leakage current in absence of light;
$V_F$=forward voltage applied across the terminals of the diode;
q=absolute value of electron charge;
k=Boltzmann's constant;
T=absolute temperature.

Figure 4:
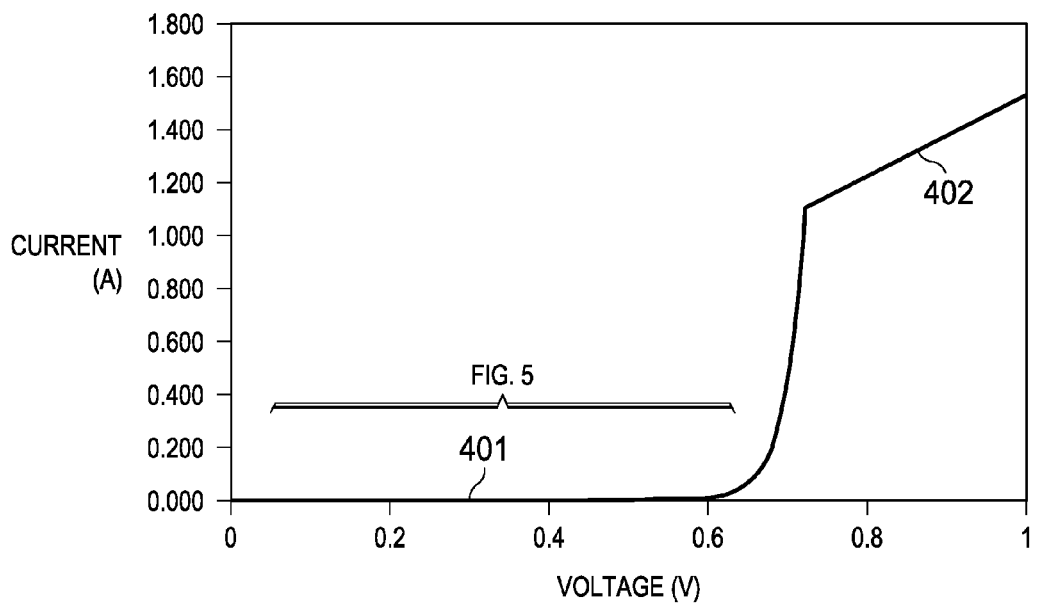
FIG. 4 is a generalized current-voltage plot of the forward characteristic of a silicon diode, with both current (ordinate) and voltage (abscissa) plotted linearly.

FIG. 4 shows a generalized current-voltage plot of the forward characteristic of a silicon diode, with both current (ordinate, in amperes) and voltage (abscissa, in volts) plotted linearly. Since the units of current (linear amperes) are relatively coarse, the low-current current portion, designated 401, below about 0.6 V is seemingly a horizontal line; after saturation, the characteristic portion designated 402 resembles the linear characteristic of a resistor. However, when the current constituting curve portion 401 is plotted logarithmically (see FIG. 5), the characteristic looks quite different.

Figure 5:
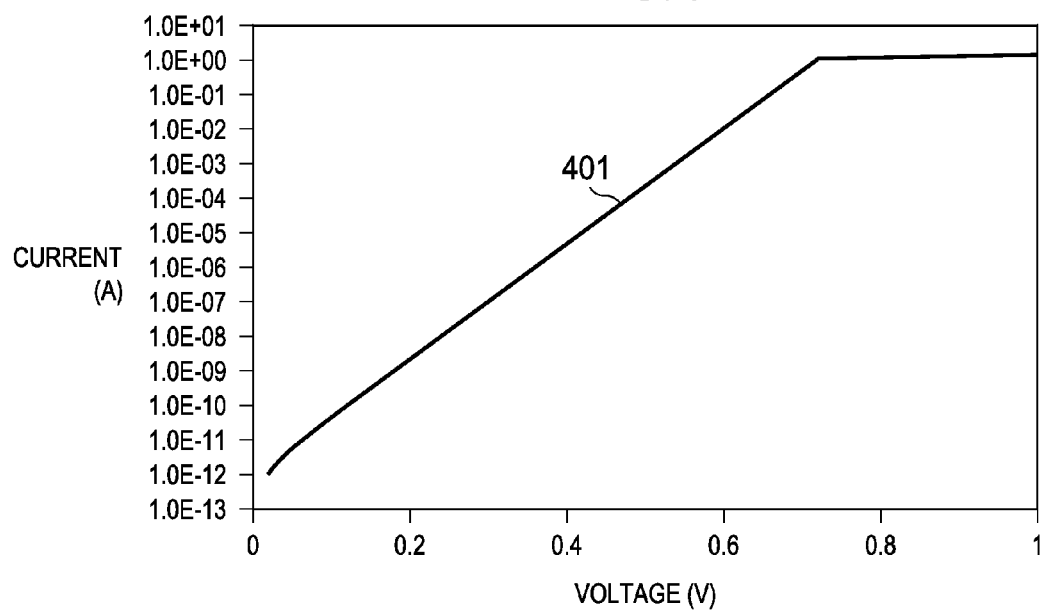
FIG. 5 shows the portion at low currents of the current-voltage plot of FIG. 4 in a semi-logarithmic graph, wherein the current is plotted logarithmically so that the curve highlights the approximately linear portion, which exhibits a slope relative to the abscissa.

According to the logarithmically plotted current (in amperes) in FIG. 5, the portion 401 of the current/voltage characteristic of the forward biased silicon diode exhibits approximately linear relationship extending over several orders of magnitude of small current. The curve depicted in the semi-logarithmic plot of FIG. 5 is obtained for a preselected stable temperature. The voltage range of the substantial linearity depends on the materials and fabrication properties of the p-n junction of the diode.

Figure 6:
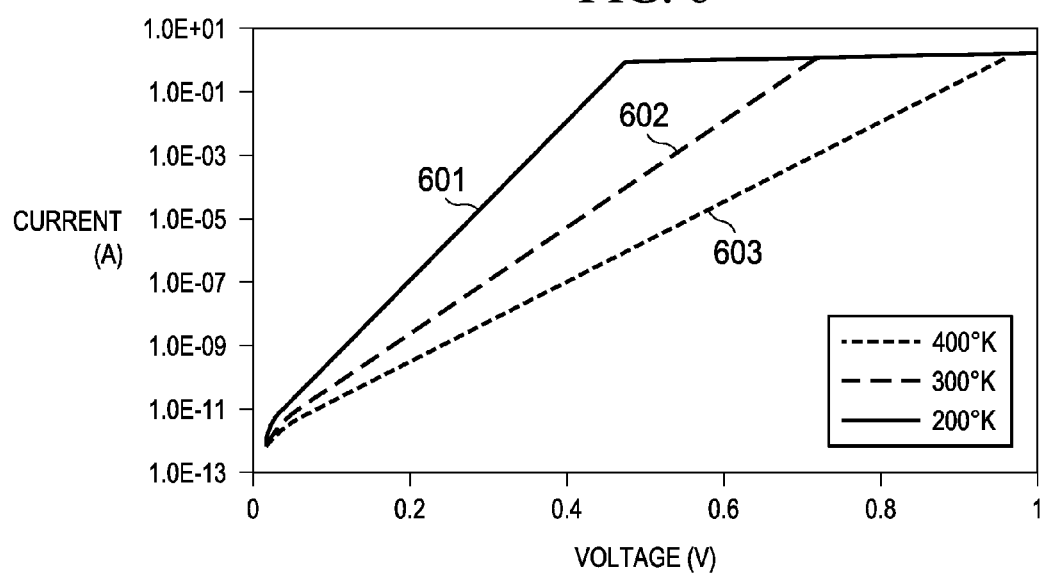
FIG. 6 illustrates the temperature dependence of the approximately linear portion of the forward current shown in FIG. 5.

When the DUT is stabilized at several temperatures consecutively, the semi-logarithmic current/voltage characteristic of the selected silicon diode of the protection circuit shows a substantially linear portion of temperature dependence at various slopes and approximately parallel-shifted positions. In order to illustrate the temperature dependence of the approximately linear curve portion, the temperature dependence of the forward current is shown in FIG. 6 over a wide temperature range (from 200° K to 400° K) and a wide range of forward current ($10^{-11}$ A to $10^{-1}$ A). Curve 601 is measured at 200° K, curve 602 at 300° K, and curve 603 at 400° K.

Figure 7:
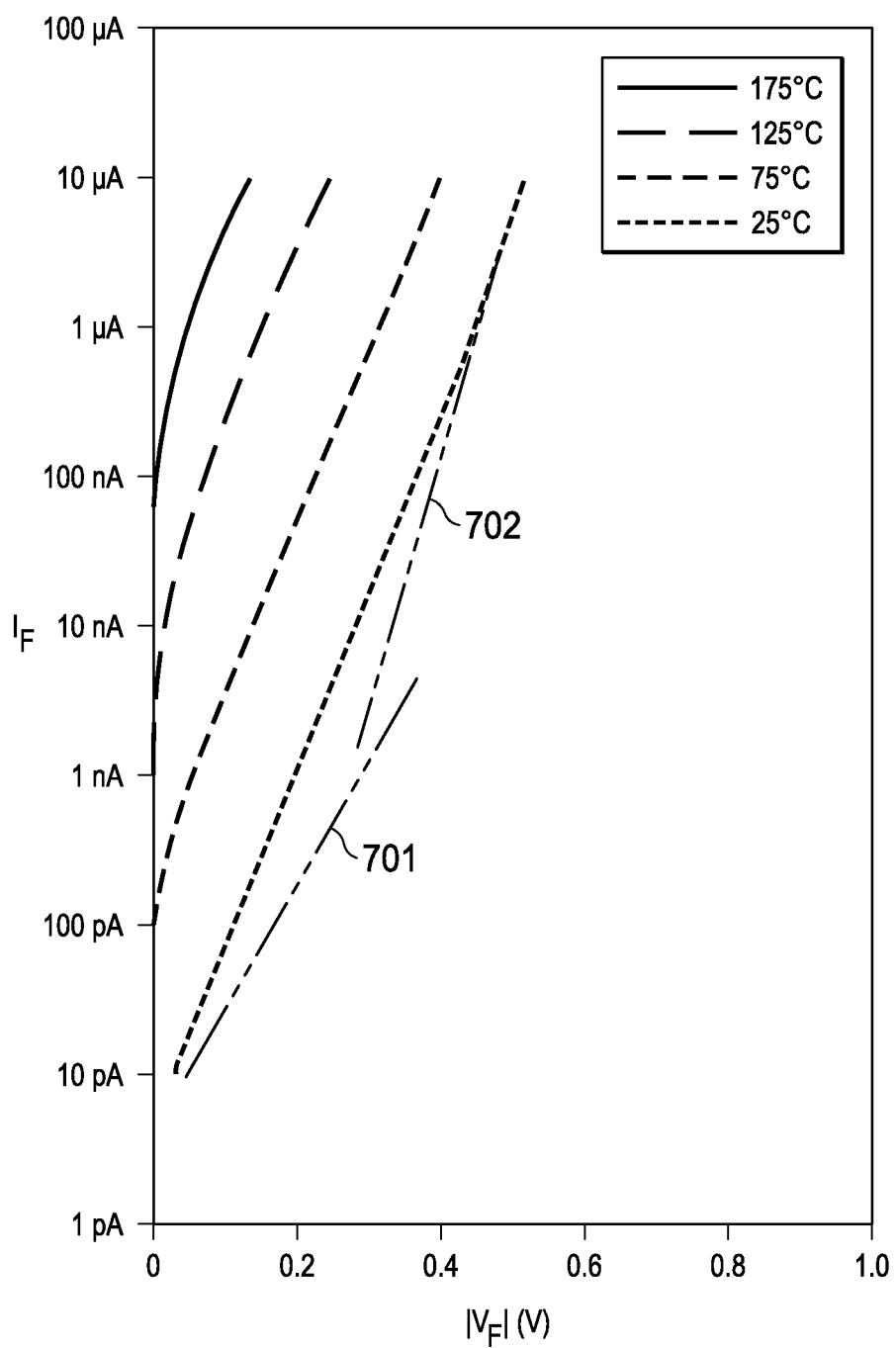
FIG. 7 depicts the temperature dependence of the forward current of a silicon diode on a refined scale (after A.S. Grove, Physics and Technology of Semiconductor Devices, p. 188, FIG. 6.23b, John Wiley & Sons, Inc., 1967).

On a more restricted scale compared to FIG. 6, FIG. 7 depicts the temperature dependence of the forward current $I_F$ of the silicon diode as a function of the forward voltage $V_F$ for a narrower temperature range (from 25° C. to 175° C.) and a narrower range of forward current ($10^{-11}$ A to $10^{-5}$ A). For ambient temperature (25° C.), the graph shows the different voltage dependences of the recombination current component 701 and the diffusion current component 702, which correspond to slopes of q/2kT and q/kT, respectively. The slope changes as the diffusion current begins to dominate with increasing forward bias. FIG. 7 also illustrates the predominance of the diffusion current and the recombination current as components of the forward current of the junction, and the transition region from one predominance to the other. For silicon at ambient temperature, the recombination current generally dominates at small forward voltages, Line 701 in FIG. 7, slope exp ($qV_F/2kT$), and the diffusion current usually dominates at forward voltages larger than about 0.4 to 0.5 V, Line 702 in FIG. 7, slope exp ($qV_F/kT$).

Based on data as plotted FIG. 7, a measurement of the junction voltage of the diode at a certain current allows the conversion to the temperature of the diode and thus the semiconductor device. Using this reading as an input to the computer of the feedback loop of FIG. 1 allows an update of the thermal stream controlled by the TFU and thus a renewed forcing of a temperature adjustment of the DUT in the ATE.

Figure 8:
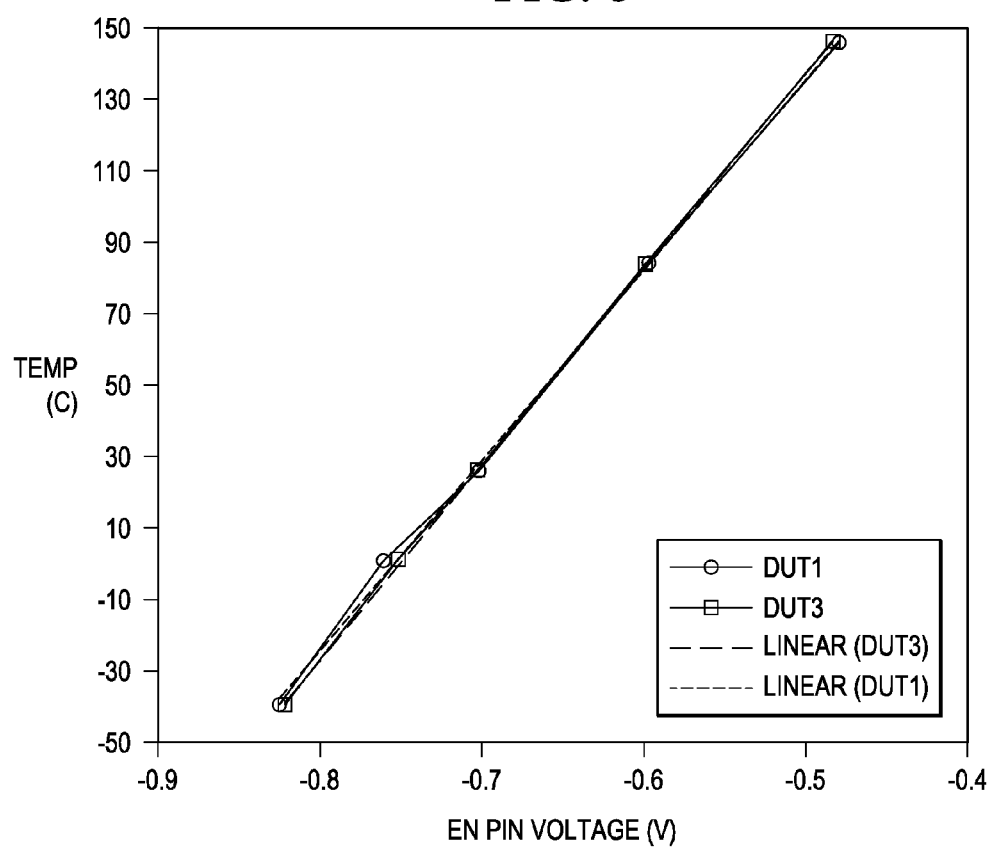
FIG. 8 shows exemplary data plotting measured voltages across diodes of a plurality of devices-under-test (DUT) at various controlled temperatures of the DUT, resulting in a linear relationship between voltage and temperature.

For calibration purposes, a plurality of consecutive temperatures have been established from a plurality of devices-under-test positioned in an ATE. In FIG. 8, a sequence of temperatures, carefully controlled in the chamber of the automated test equipment (ATE), are plotted against the voltage drops across the diodes under forward bias. Both the voltage on the abscissa and the temperature on the ordinate are plotted linearly. The data was obtained from a couple of is different protection diodes of semiconductor devices (DUT1 and DUT3) in a chamber well controlled for temperature uniformity. As FIG. 8 shows, the data of the diodes is in excellent agreement between the devices. FIG. 8 further demonstrates that the relationship of temperature versus voltage, both plotted linearly, very closely follows a straight line. This dependence allows the determination of a linear equation correlating voltage measurements with deduced temperatures.

Figure 9:
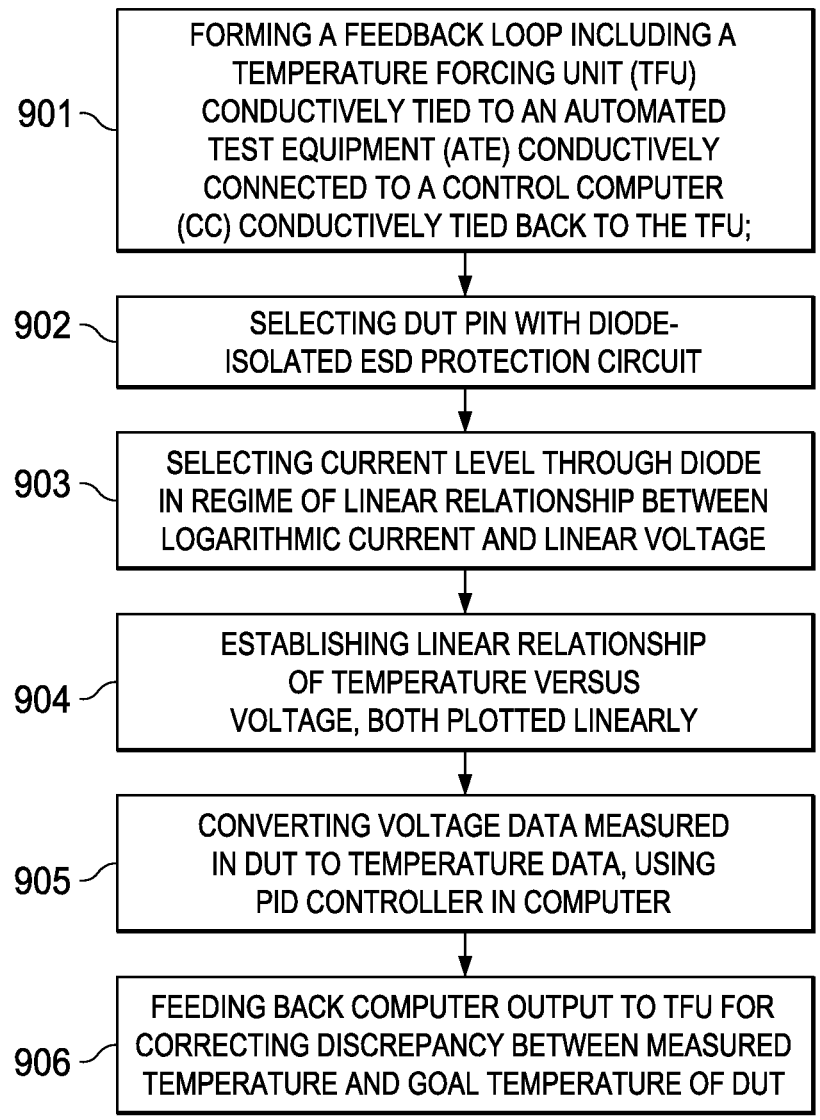
FIG. 9 illustrates the flow of processes in the method for measuring and controlling the internal temperature of a semiconductor device.

Another embodiment of the invention is a method to measure and control the internal temperature of a semiconductor device. The method includes a sequence of processes as indicated in FIG. 9. The method starts (in 901) by forming a feedback loop including a Temperature Forcing Unit (TFU) conductively tied to an Automated Test Equipment (ATE) conductively connected to a Control Computer (CC) conductively tied back to the TFU. A semiconductor device-under-test (DUT) is loaded into the ATE, and the software of a proportional-integral-derivative (PID) controller is loaded into the CC.

In the next process 902 a pin of the DUT is selected, which is protected against electrostatic discharge damage by a diode-isolated grounded-gate circuit, wherein the circuit is not immersed in a lot of extra circuitry potentially influencing current and voltage readings. The diode of the protection circuit will serve as the instrument for temperature readings.

The DUT is placed in the chamber of an automated test equipment (ATE), which can establish a carefully controlled temperature. In process 903, the diode is forward biased. A regime is determined, which exhibits an approximately linear relationship between the current plotted logarithmically and the voltage plotted linearly. An appropriate current level through the diode is selected, allowing the reading of the voltage drop. The reading can be repeated at a plurality of carefully controlled temperatures.

In process 904, a diagram is established, where both the temperature and the voltage are plotted linearly. The diagram shows a substantially linear relationship between voltage and temperature. A linear equation is established representing the linear relationship. Using the equation, a measured voltage drop of the forward biased diode can be converted to the DUT temperature.

In process 905, the voltage data measured in the temperature-controlled chamber of the ATE is looped back to the PID controller in the computer, which converts voltage data to temperature data. Then, the PID compares the temperature input with the goal temperature required for the DUT, and if necessary, calculates any changes of the thermal stream to correct an observed discrepancy between the measured temperature and the goal temperature. Since the input to the control computer arrives from the DUT in the ATE and the output is tied to the TFU, the CC closes the loop by providing commands to the thermal stream of the measurement chamber of the ATE.

The method concludes by process 906, wherein the CC closes the loop by feeding back the CC output to the TFU. Based on this feedback, the TFU receives the commands needed to modify the thermal stream of the measurement chamber of the ATE, and thus correct any discrepancy between the measured temperature and the goal temperature of the DUT.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to diodes of discharge protection circuits using field effect transistors, but also to diodes of protection circuits using other suitable power transistors, bipolar transistors, insulated gate transistors, thyristors, and others.

As another example, the invention applies to industrial DC-DC-users with attention to PID tuning, which includes a proportional constant, an integral constant, and a derivative constant.

It is therefore intended that the appended claims encompass any such modifications or embodiments.

I claim:

1. An apparatus for controlling the temperature of a semiconductor device-under-test (DUT), comprising:
   a feedback loop including a Temperature Forcing Unit (TFU) conductively tied to an Automated Test Equipment (ATE) having a chamber encasing the DUT, and the ATE conductively connected to a Control Computer (CC) tied back to the TFU;
   the TFU operable to control the thermal air stream setting the temperature in the ATE chamber encasing the DUT;
   the ATE operable to measure the internal temperature of the DUT by monitoring the voltage drop across a DUT diode integral to an electrostatic discharge (ESD) circuit protecting a DUT pin; and
   the CC operable to correlate the measured voltage drop with a temperature, to compare the correlated temperature with a desired goal temperature, to calculate a revised thermal air stream for eliminating any discrepancy between the correlated and the desired goal temperature, and to command the TFU to revise the thermal air stream.

2. The apparatus of claim 1 wherein the TFU includes one or more fans to accomplish temperature uniformity of the ambient air surrounding the DUT.

3. The apparatus of claim 1 wherein the ATE selects a diode suitable as thermometer from the plurality of diodes integrated in ESD protection circuits of DUT pins so that the diode is not normally participating in routine device operation and is having its current/voltage characteristic measured at a plurality of stable temperatures.

4. The apparatus of claim 3 wherein the ATE is operable
   to measure the current/voltage characteristic of the selected diode at a plurality of stable temperatures values;
   to record, for each temperature value, the current values logarithmically and the voltage values linearly;
   to determine, at each temperature value, the linear regime of the semi-logarithmic current-voltage characteristic; and
   to compare, at a selected current in the linear regime, the temperature value as a function of the measured voltage drop, establishing a linear relation between temperature and voltage.

5. The apparatus of claim 1 wherein the CC includes a proportional-integral-derivative (PID) software, operable as a control loop feedback mechanism, wherein the PID software calculates an error value as the difference between a measured process variable (such as the measured temperature) and a desired setpoint (such as the desired goal temperature).

6. A method for controlling the temperature of a semiconductor device-under-test (DUT), comprising:
   forming an apparatus including a feedback loop between a Temperature Forcing Unit (TFU) conductively tied to an Automated Test Equipment (ATE) having a chamber encasing the DUT, and the ATE conductively connected to a Control Computer (CC) conductively tied back to the TFU;
   calibrating the CC with reference values of temperatures and measured voltages by completing the processes of:
      selecting a diode integral with a diode-isolated circuit protecting a pin of the DUT against electrostatic discharge;
      measuring the voltage drop across the diode by a current selected in the regime of linear relationships between logarithmic current and linear voltage; and
      confirming a linear relationship between temperature and voltage by repeating the voltage drop measurements at a plurality of temperatures, recording the voltage and the temperature linearly;
   operating thermal air stream to stabilize the temperature of the ATE chamber loaded with a DUT at a preliminary value close to a pre-set goal temperature;
   measuring the preliminary DUT temperature using the processes for calibrating the CC, and determining any discrepancy to the goal temperature;
   calculating a revised thermal air stream for eliminating the discrepancy; and
   directing the TFU to reset the thermal air stream until the DUT is stabilized at the goal temperature.

7. The method of claim 6 wherein the process of operating thermal air stream is directed by the TFU.

8. The method of claim 6 wherein the process of calculating is performed by the CC loaded with a proportional-integral-derivative (PID) software.

9. The method of claim 6 wherein the process of directing is performed by the CC.

* * * * *